United States Patent
Shur et al.

(10) Patent No.: US 10,026,872 B2
(45) Date of Patent: Jul. 17, 2018

(54) HETEROSTRUCTURE WITH STRESS CONTROLLING LAYER

(71) Applicant: Sensor Electronic Technology, Inc., Columbia, SC (US)

(72) Inventors: Michael Shur, Latham, NY (US); Alexander Dobrinsky, Loudonville, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/173,661

(22) Filed: Jun. 5, 2016

(65) Prior Publication Data
US 2016/0359081 A1  Dec. 8, 2016

Related U.S. Application Data

(60) Provisional application No. 62/171,361, filed on Jun. 5, 2015.

(51) Int. Cl.
*H01L 33/44* (2010.01)
*H01L 33/12* (2010.01)
(Continued)

(52) U.S. Cl.
CPC .......... *H01L 33/44* (2013.01); *H01L 29/0657* (2013.01); *H01L 33/12* (2013.01); *H01L 21/0254* (2013.01); *H01L 21/02458* (2013.01); *H01L 21/02587* (2013.01); *H01L 21/02664* (2013.01); *H01L 29/2003* (2013.01); *H01L 29/778* (2013.01); *H01L 33/0075* (2013.01); *H01L 33/32* (2013.01); *H01L 33/382* (2013.01)

(58) Field of Classification Search
None
See application file for complete search history.

(56) References Cited

U.S. PATENT DOCUMENTS

2007/0072396 A1  3/2007  Feltin et al.
2008/0283854 A1  11/2008  Iza et al.
(Continued)

FOREIGN PATENT DOCUMENTS

| JP | 2007-123439 A | 5/2007 |
| JP | 2008124340 A | 5/2008 |
| KR | 10-1146819 B1 | 5/2012 |

OTHER PUBLICATIONS

Park, International Application No. PCT/US2016/035939, International Search Report and Written Opinion, dated Sep. 12, 2016, 9 pages.
(Continued)

*Primary Examiner* — Reema Patel
*Assistant Examiner* — Steven Christopher
(74) *Attorney, Agent, or Firm* — Labatt, LLC

(57) ABSTRACT

A solution for fabricating a device is described. The solution can include fabricating a heterostructure for the device, which includes at least one stress controlling layer. The stress controlling layer can include one or more attributes varies as a function of a lateral position based on a target variation of stresses in a semiconductor layer located directly under the stress controlling layer. Embodiments are further directed to a heterostructure including at least one stress controlling layer and a device including the heterostructure.

20 Claims, 12 Drawing Sheets

(51) Int. Cl.
*H01L 29/06* (2006.01)
*H01L 33/32* (2010.01)
*H01L 33/00* (2010.01)
*H01L 33/38* (2010.01)
*H01L 21/02* (2006.01)
*H01L 29/778* (2006.01)
*H01L 29/20* (2006.01)

(56) References Cited

U.S. PATENT DOCUMENTS

| | | | |
|---|---|---|---|
| 2011/0049544 A1* | 3/2011 | Komada | H01L 21/0242 257/97 |
| 2011/0073951 A1 | 3/2011 | Chatty et al. | |
| 2012/0220060 A1* | 8/2012 | Kobayashi | H01L 31/18 438/29 |
| 2013/0026525 A1* | 1/2013 | Chen | H01L 33/60 257/98 |
| 2013/0193476 A1 | 8/2013 | Diana et al. | |
| 2013/0200495 A1* | 8/2013 | Keller | H01L 21/0237 257/615 |
| 2014/0110754 A1 | 4/2014 | Jain et al. | |
| 2014/0134773 A1 | 5/2014 | Jain et al. | |
| 2014/0134775 A1 | 5/2014 | Yang et al. | |
| 2014/0326950 A1 | 11/2014 | Shatalov et al. | |
| 2015/0108428 A1 | 4/2015 | Shatalov et al. | |
| 2015/0295127 A1 | 10/2015 | Shur et al. | |
| 2015/0295133 A1 | 10/2015 | Billingsley et al. | |
| 2015/0372193 A1 | 12/2015 | Jain et al. | |
| 2016/0093771 A1 | 3/2016 | Shatalov et al. | |
| 2016/0104791 A1* | 4/2016 | Morvan | H01L 29/66462 438/168 |
| 2016/0172532 A1* | 6/2016 | Rhee | H01L 33/32 438/39 |
| 2016/0190387 A1 | 6/2016 | Sun et al. | |

OTHER PUBLICATIONS

Green, D.S. et al., "Control of epitaxial defects for optimal AlGaN/GaN HEMT performance and reliability," Journal of Crystal Growth, Dec. 2004, Abstract.

Jain, R. et al., "Migration enhanced lateral epitaxial overgrowth of AlN and AlGaN for high reliability deep ultraviolet light emitting diodes," Applied Physics Letters, vol. 93, No. 5, p. 051113, 2008.

Sakai, Y. et al., "Demonstration of AlGaN-Based Deep-Ultraviolet Light-Emitting Diodes on High-Quality AlN Templates," Japanese Journal of Applied Physics, Feb. 2010, Abstract.

Wu, X.H. et al., "Dislocation generation in GaN heteroepitaxy," Journal of Crystal Growth, vol. 189-190, 1998, Abstract.

* cited by examiner

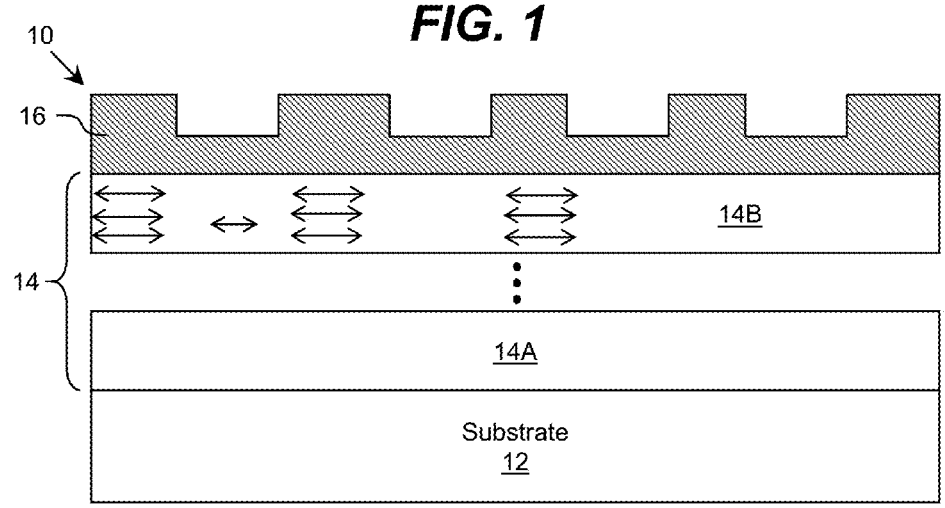
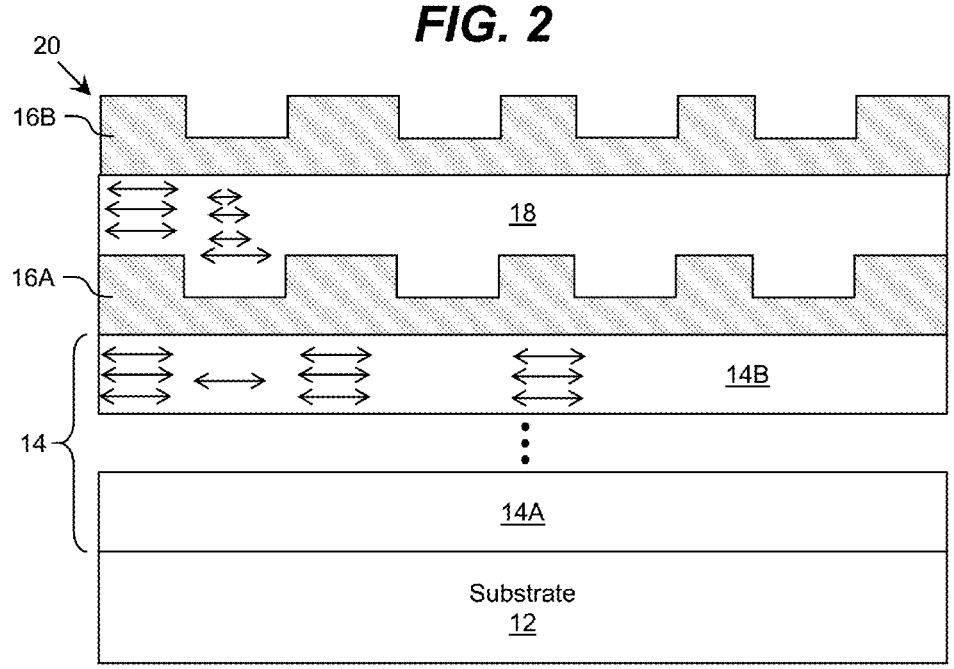

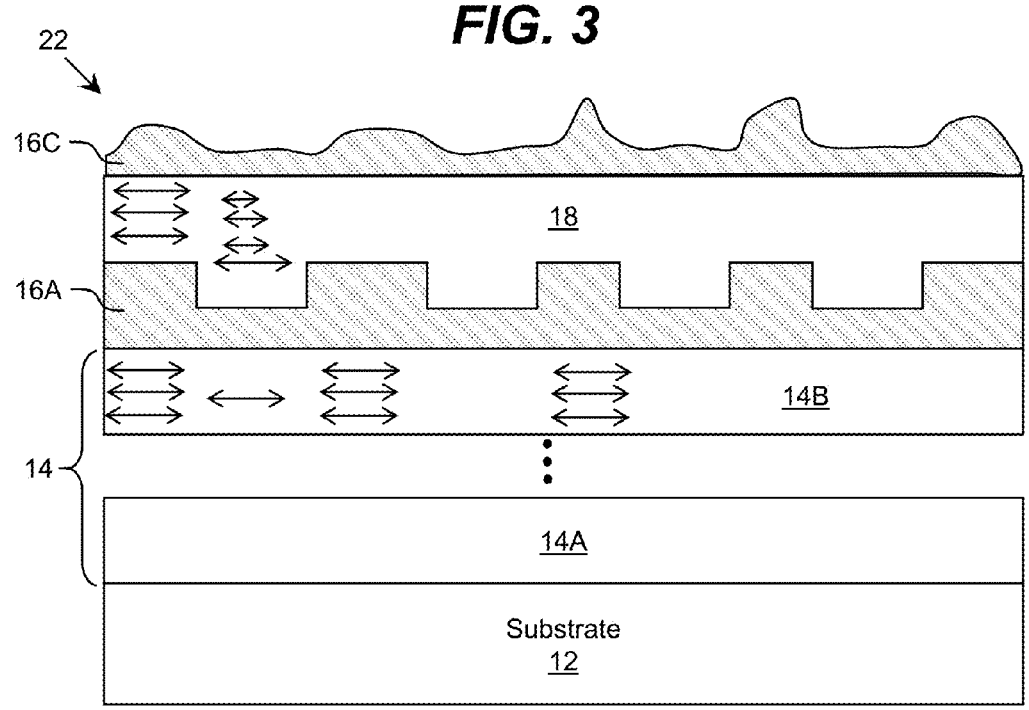

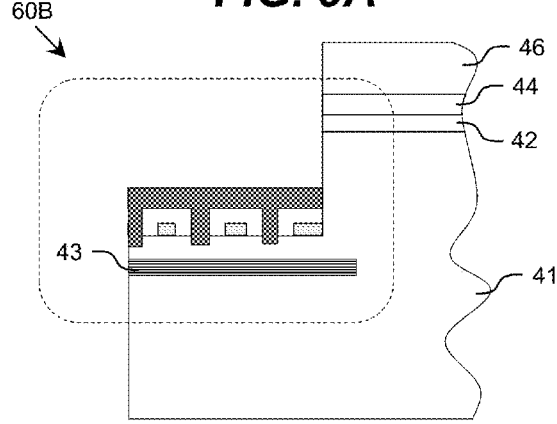
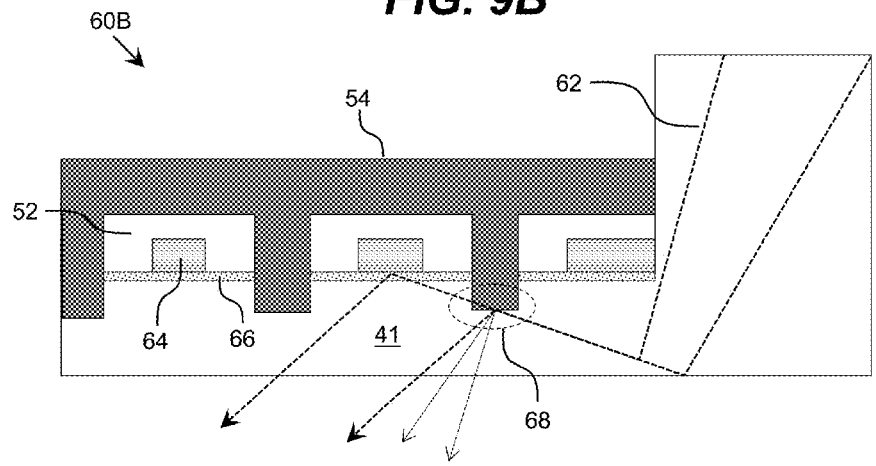

HETEROSTRUCTURE WITH STRESS CONTROLLING LAYER

REFERENCE TO RELATED APPLICATIONS

The current application claims the benefit of U.S. Provisional Application No. 62/171,361, which was filed on 5 Jun. 2015, and which is hereby incorporated by reference.

TECHNICAL FIELD

The disclosure relates generally to semiconductor devices, and more particularly, to controlling stress in a semiconductor layer.

BACKGROUND ART

With light emitting diodes, particularly ultraviolet light emitting diodes based on group III nitride semiconductor layers, increasing in complexity, efficiency, reliability, and lifetime, and thus the costs associated with the light emitting diodes, becomes increasingly important for customers.

Fabrication of high-quality aluminum gallium nitride (AlGaN) layers using epitaxy continues to be challenged by a lack of matched substrates. Threading dislocations that result from heteroepitaxy are responsible for leakage currents, trapping effects, and may adversely affect device reliability. Aluminum nitride (AlN) nucleation conditions have been determined to be important for reliability of the device when grown on silicon carbide (SiC) substrates. In particular, it was found that variation of the nucleation temperature, V/III ratio, and thickness have a dramatic effect on the balance between edge, screw and mixed character dislocation densities. Electrical and structural properties have been assessed on a material level by AFM and XRD and at the device level through DC and RF performance. The ratio between dislocation characteristics has been established primarily through comparison of symmetric and asymmetric XRD rocking curve widths.

There are situations where the presence of polarization fields in group III nitrides can dramatically change the performance of the device. For example, HEMT devices based on group III nitride heterostructure specifically employ polarization properties of the semiconductor layers for optimal performance.

SUMMARY OF THE INVENTION

Aspects of the invention provide a solution for fabricating a device. The solution can include fabricating a heterostructure for the device, which includes at least one stress controlling layer. The stress controlling layer can include one or more attributes varies as a function of a lateral position based on a target variation of stresses in a semiconductor layer located directly under the stress controlling layer. Embodiments are further directed to a heterostructure including at least one stress controlling layer and a device including the heterostructure.

A first aspect of the invention provides a method of fabricating a device, the method comprising: fabricating a heterostructure for the device, wherein the fabricating the heterostructure includes fabricating a stress controlling layer directly on a surface of a semiconductor layer in a set of semiconductor layers, wherein the fabricating the stress controlling layer includes varying at least one attribute of the stress controlling layer as a function of a lateral position based on a target variation of stresses in the semiconductor layer.

A second aspect of the invention provides a method of fabricating a device, the method comprising: fabricating a heterostructure for the device, wherein the fabricating the heterostructure includes fabricating a stress controlling layer directly on a surface of a semiconductor layer in a set of semiconductor layers, wherein the fabricating the stress controlling layer includes varying a thickness of the stress controlling layer as a function of a lateral position based on a target variation of stresses in the semiconductor layer; and forming at least one contact directly on the stress controlling layer.

A third aspect of the invention provides a method of fabricating a device, the method comprising: fabricating a group III nitride heterostructure for the device, wherein the fabricating the heterostructure includes fabricating a stress controlling layer directly on a surface of a group III nitride semiconductor layer in a set of group III nitride semiconductor layers, wherein the fabricating the stress controlling layer includes varying a thickness of the stress controlling layer as a function of a lateral position based on a target variation of stresses in the group III nitride semiconductor layer.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 1 shows an illustrative heterostructure according to an embodiment.

FIG. 2 shows another heterostructure according to an embodiment.

FIG. 3 shows an illustrative heterostructure including stress controlling layer having differing attributes according to an embodiment.

FIG. 7A shows an illustrative optoelectronic device according to an embodiment, while

FIGS. 9A and 9B show an illustrative contact structure according to another embodiment.

DETAILED DESCRIPTION OF THE INVENTION

Figure 4A:
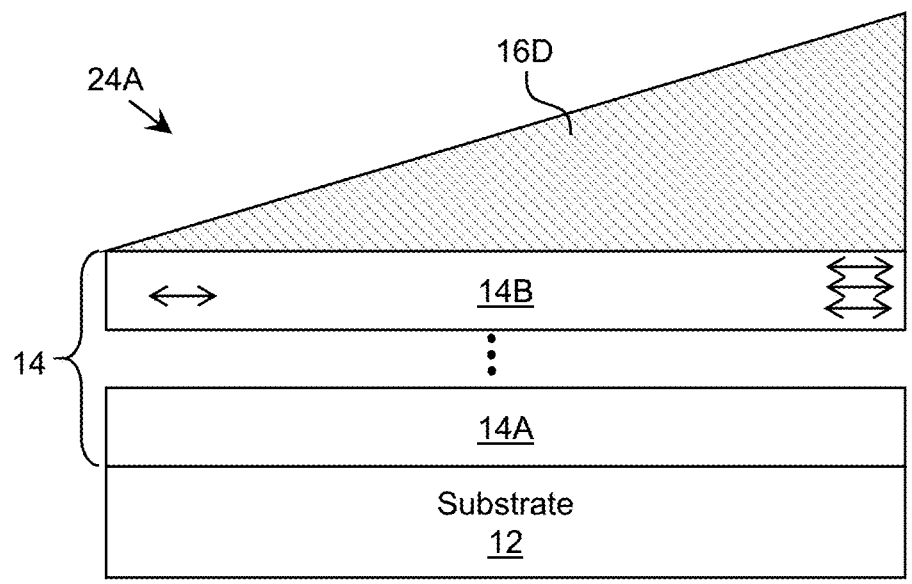
FIGS. 4A and 4B show illustrative heterostructures according to embodiments.

As indicated above, aspects of the invention provide a solution for fabricating a device. The solution can include fabricating a heterostructure for the device, which includes at least one stress controlling layer. The stress controlling layer can include one or more attributes varies as a function of a lateral position based on a target variation of stresses in a semiconductor layer located directly under the stress controlling layer. Embodiments are further directed to a heterostructure including at least one stress controlling layer and a device including the heterostructure.

As used herein, unless otherwise noted, the term "set" means one or more (i.e., at least one) and the phrase "any solution" means any now known or later developed solution. It is understood that, unless otherwise specified, each value is approximate and each range of values included herein is inclusive of the end values defining the range. As used herein, unless otherwise noted, the term "approximately" is inclusive of values within +/−ten percent of the stated value, while the term "substantially" is inclusive of values within +/−five percent of the stated value. Unless otherwise stated, two values are "similar" when the smaller value is within +/−twenty-five percent of the larger value. A value, y, is on the order of a stated value, x, when the value y satisfies the formula $0.1x \leq y \leq 10x$.

As also used herein, a layer is a transparent layer when the layer allows at least ten percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength +/−five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/−one percent).

Turning to the drawings, FIG. 1 shows an illustrative heterostructure 10 according to an embodiment. As illustrated, the heterostructure 10 can include a substrate 12 on which a set of semiconductor layers 14 are fabricated (e.g., grown). A stress controlling layer 16 is subsequently formed directly on one of the set of semiconductor layers 14, such as the semiconductor layer 14B. While the set of semiconductor layers 14 is shown including two or more semiconductor layers 14A, 14B, it is understood that the set of semiconductor layers 14 can include any number of one or more semiconductor layers.

The particular attributes of the heterostructure 10 can be selected based on a target type of device to be fabricated from the heterostructure 10. An embodiment of the substrate 12 is formed of silicon carbide (SiC). However, it is understood that the substrate 12 can be formed of any suitable material including, for example, sapphire, silicon (Si), bulk GaN, bulk AlN, bulk or a film of AlGaN, bulk or a film of BN, AlON, $LiGaO_2$, $LiAlO_2$, aluminum oxinitride ($AlO_xN_y$), $MgAl_2O_4$, GaAs, Ge, or another suitable material suitable for growth of the semiconductor layers 14 thereon.

In an illustrative embodiment, the heterostructure 10 is a group III-V materials based heterostructure, in which some or all of the various semiconductor layers 14, 16 are formed of elements selected from the group III-V materials system. In a still more particular illustrative embodiment, the various layers of the heterostructure 10 are formed of group III nitride based materials. Group III nitride materials comprise one or more group III elements (e.g., boron (B), aluminum (Al), gallium (Ga), and indium (In)) and nitrogen (N), such that $Al_wGa_xIn_yB_zN$, where $0 \leq w, z, y, z \leq 1$, and $w+x+y+z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

A composition of each semiconductor layer in the heterostructure 10 can differ from a composition of the immediately adjacent semiconductor layer(s) in the heterostructure 10 by one or more of: the material (e.g., the semiconductor alloy composition); the ratio of group V elements to group III elements (V/III ratio); doping; and/or the like. Furthermore, immediately adjacent semiconductor layers in the heterostructure 10 can be grown using differing growth regimes, such as different growth temperatures, pressures, flow rates, ratios of group V precursors to group III precursors (V/III precursor ratio), and/or the like. In an embodiment, one or more semiconductor layers in the heterostructure 10 includes sub-scale features. To this extent, one or more semiconductor layers in the heterostructure 10 can have a varying (e.g., graded) composition, varying doping, and/or the like. Such variations can occur in the growth direction and/or lateral with respect to the growth direction and exceed unintentional variations due to the limitations of the growth process. Additionally, a semiconductor layer can comprise a superlattice of sub-layers, such as a short period superlattice structure (SPSL).

In an embodiment, the heterostructure 10 includes one or more layers of piezoelectric materials. For example, the piezoelectric material layer(s) can be located within the set of semiconductor layers 14 or can be deposited over the set of semiconductor layers 14. In an embodiment, the piezoelectric layers may be deposited over the substrate 12 prior to epitaxial growth of the set of semiconductor layers 14. Regardless, the piezoelectric layers can be patterned to allow epitaxial growth using an epitaxial lateral overgrowth approach. Such layers can comprise materials such as lithium niobate, lithium tantalite, $SiO_2$, $SiN_x$, MgO, ZnO, AlZnO, and/or the like.

As discussed herein, the heterostructure 10 includes a semiconductor layer 14B having modulated stresses. The stress modulation can occur due to a stress controlling layer 16. In particular, the stress controlling layer 16 has at least one attribute that varies laterally to create varying stresses in the semiconductor layer 14B. To this extent, fabrication of the stress controlling layer 16 can include varying at least one attribute of the stress controlling layer 16 as a function of a lateral position based on a target variation of resulting stresses in the semiconductor layer 14B. In an embodiment, the stress controlling layer 16 can be epitaxially (pseudomorphically) grown over the semiconductor layer 14B. In a more particular embodiment, a lattice constant of the stress controlling layer 16 can differ from the lattice constant of the semiconductor layer 14B. For example, a lattice mismatch between the stress controlling layer 16 and the semiconductor layer 14B can be at least 0.2%.

Furthermore, stress modulation within the semiconductor layer 14B can be accomplished using one or more variations of the fabrication process used for the stress controlling layer 16. For example, a degree of stress in the stress controlling layer 16 can be adjusted by thermal annealing, laser thermal annealing, and/or the like. The stress variation within the semiconductor layer 14B can create high stress regions and low stress regions. In an embodiment, the stress controlling layer 16 can be formed of a material having a thermal expansion coefficient that differs from that of the semiconductor layer 14B. In this case, the deposition temperature used during deposition of the stress controlling layer 16 can be lowered during cool down, resulting in a change of strain during the cool down process.

In an embodiment, the stresses in the regions vary by at least five percent. In an illustrative embodiment, the high and/or low stress regions can have a characteristic size (e.g., a cross-sectional diameter) that is selected based on one or more attributes of dislocations present in the semiconductor layer 14B. For example, the high and/or low stress regions can have characteristic sizes that are smaller than the characteristic (e.g., average) distance between the dislocations in the semiconductor layer 14B. In this case, the high stress region(s) can locally affect a bandgap of the semiconductor layer 14B leading to, for example, carrier localization between dislocation cores.

The stress controlling layer 16 can be fabricated from any suitable material. For example, the stress controlling layer 16 can be formed from a group III nitride material. Alternatively, the stress controlling layer 16 can be formed from a dielectric, such as silicon dioxide, silicon nitride, or the like. In an embodiment, the stress controlling layer 16 is formed of a high-K dielectric such as $HfO_2$. In still another embodiment, the stress controlling layer 16 can have a conductance that is controlled by incorporating nanoparticles into the stress controlling layer 16. For example the nanoparticles can comprise silver or aluminum nanoparticles. In another embodiment, the stress controlling layer 16 can comprise a piezoelectric material such as $SiO_2$, or lithium niobate and/or the like. The stress controlling layer 16 can further include a mechanism, such as a contact attached thereto, to enable an external voltage to be applied to the stress controlling layer 16 thereby changing the stresses induced in the semiconductor layer 14B. In this case, the stress controlling layer 16 can be electrically insulated from other portions of the corresponding device, e.g., via a dielectric layer, or the like.

In an embodiment, the stress controlling layer 16 has a variable thickness that creates variable stresses in different portions of the semiconductor layer 14B. For example, as illustrated, the semiconductor layer 14B can have higher stresses in regions below the thicker portions of the stress controlling layer 16 as compared to the stresses present in regions below the thinner regions of the stress controlling layer 16. The stresses can be compressive or tensile, which can depend on the properties of the stress controlling layer 16, such as lattice mismatch, thermal expansion characteristics, and/or the like. The variation in thickness of the stress controlling layer 16 exceeds unintentional variations that may be present due to limitations of a growth process. In an embodiment, the thickness of the stress controlling layer 16 can vary significantly, e.g., by several microns (e.g., 2-10 microns) to induce a target amount of stress in the semiconductor layer 14B. In an embodiment, the stress controlling layer 16 is discontinuous. The stress controlling layer 16 can be fabricated using any solution. For example, changes in the thickness of the stress controlling layer 16 can be obtained through the use of etching, masking, inducing a three dimensional growth mode characterized by large surface roughness, a combination of one or more of these methods, and/or the like.

The modulation of stress within the semiconductor layer 14B can lead to a modulation of piezo-induced polarization fields. The modulation of polarization fields can result in a characteristic charge distribution defined by the polarization field within group III nitrides. The values of the polarization field induced by stress are well known in art. The charge can be induced at the interface of the layers 14B, 16. The distribution of induced charge will match the charge of free carriers at the layer boundary. The free carrier charge can result in improved lateral conductive properties of the heterostructure 10. In addition, control of the stress within a set of semiconductor layers of the heterostructure 10 affects the presence of dislocations and can result in a reduction in the number of dislocations. For instance, the semiconductor layer 16 will experience modulated stresses as well as the semiconductor layer 14B, which can affect the dislocation density.

An embodiment of a heterostructure described herein can include more than one stress controlling layer 16. To this extent, FIG. 2 shows another heterostructure 20 according to an embodiment. In this case, the heterostructure 20 includes a set of semiconductor layers 14 on which a first stress controlling layer 16A is formed. Subsequently, another semiconductor layer 18 is formed (e.g., grown) on the first stress controlling layer 16A followed by a second stress controlling layer 16B formed (e.g., grown) thereon. While the heterostructure 20 is shown including a single semiconductor layer 18 located between two stress controlling layers 16A, 16B, it is understood that any number of semiconductor layers can be located between two stress controlling layers. Additionally, while each stress controlling layer 16A, 16B is shown having substantially the same physical dimensions, it is understood that two stress controlling layers 16A, 16B can have distinct attributes including, for example: different thicknesses, different maximum/minimum thicknesses, different lateral locations of thicker and thinner portions, thicker and thinner portions of differing dimensions, and/or the like.

Regardless, the stress controlling layers 16A, 16B can include one or more features to induce modulated stresses in the immediately adjacent layer(s) 104B, 108. In an embodiment, the semiconductor layers 104B, 108 can be n-type or p-type doped, while the stress controlling layers 16A, 16B can be undoped or weakly doped as compared to the semiconductor layers 14B, 18. For example, the stress controlling layers 16A, 16B can have a doping level an order of magnitude smaller than a doping level of the semiconductor layers 14B, 18. Alternatively, the stress controlling layers 16A, 16B can have a doping level an order of magnitude larger than a doping level of the semiconductor layers 14B, 18. The doping levels can affect the lattice constant of the stress controlling layer 16A, 16B, which can provide a mechanism to manipulate the stresses within the corresponding semiconductor layer 14B, 18.

It is understood that embodiments of a stress controlling layer described herein can have any of various configurations of varying thicknesses. For example, FIG. 3 shows an illustrative heterostructure 22 including stress controlling layers having differing attributes according to an embodiment. In this case, the heterostructure 22 includes a first stress controlling layer 16A having a thickness that varies in a regular, periodic pattern, and a second stress controlling layer 16B having a thickness with random fluctuations. To this extent, the corresponding variation in stresses in the semiconductor layers 14B, 18 can vary periodically and randomly, respectively. Random stress variations can be beneficial, for example, in reducing a possibility of cracks.

Figure 4B:
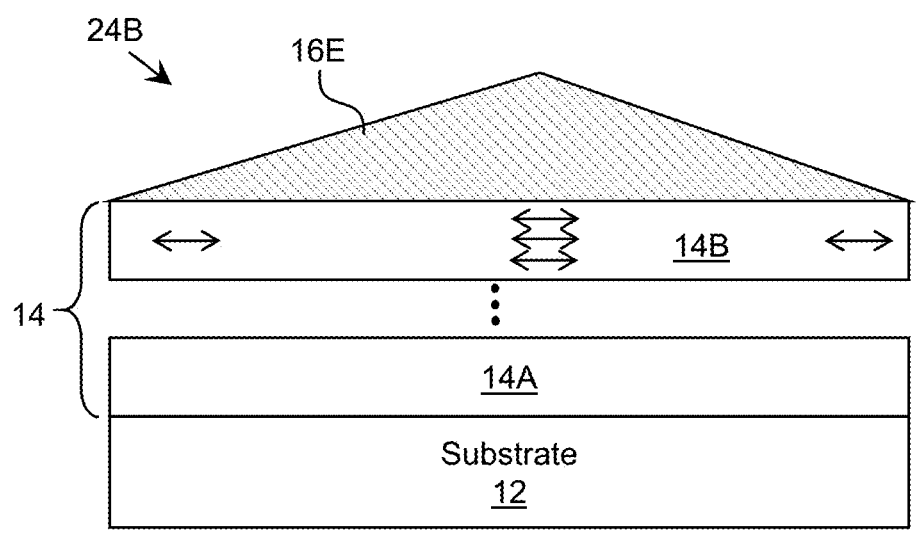

While embodiments of a stress controlling layer described herein can vary on a relatively small scale as compared to an overall size of the heterostructure, e.g., one fifth of the width of the heterostructure or smaller, it is understood that embodiments of a stress controlling layer can vary on a scale comparable to the size of the heterostructure, e.g., one fifth of the width of the heterostructure or larger. To this extent, FIGS. 4A and 4B show illustrative heterostructures 24A, 24B according to embodiments. In each case, the stress controlling layer 16D, 16E has a thickness that changes continuously on a scale relatively large as compared to a size of the heterostructure 24A, 24B. In the heterostructure 24A, the thickness of the stress controlling layer 16D increases from near zero on a first side gradually to a maximum thickness on the opposing side of the heterostructure 24A. In the heterostructure 24B, the stress controlling layer 16E has a maximum thickness in a central region of the heterostructure 24B and continuously decreases to a near zero thickness on the opposing ends of the heterostructure 24B. While the variations in thicknesses for the stress controlling layers 16D, 16E are shown as being substantially continuous, it is understood that a thickness of a stress controlling layer can vary in multiple steps.

Figure 5:
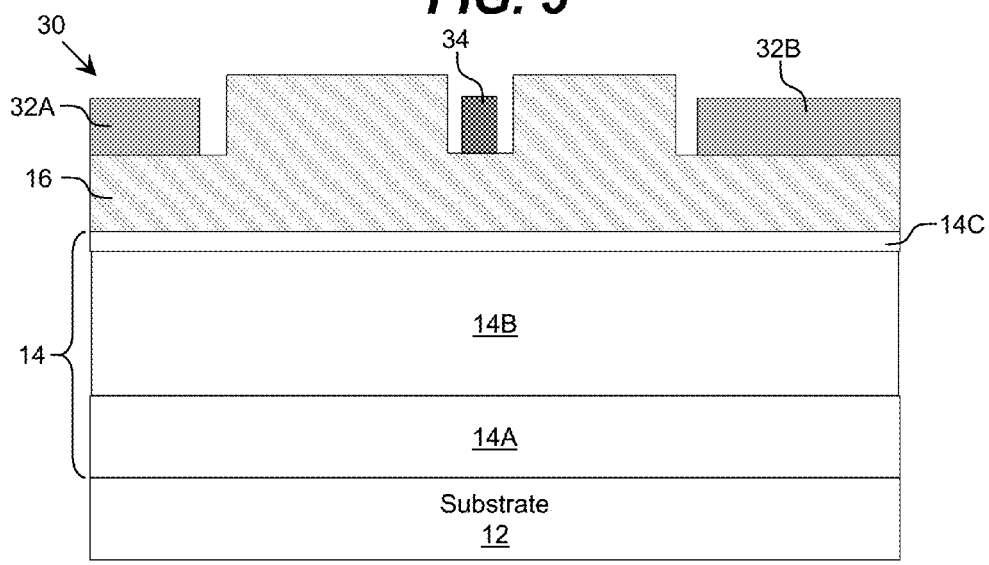
FIG. 5 shows an illustrative transistor according to an embodiment.

A heterostructure including a set of stress controlling layers can be utilized to fabricate various types of devices. In an embodiment, the device is a field effect transistor, such as a high electron mobility transistor (HEMT). For example, FIG. 5 shows an illustrative transistor 30 according to an embodiment. As illustrated, the transistor 30 includes a substrate 12 on which a set of semiconductor layers 14 is grown. The set of semiconductor layers 14 can include, for example, an AlN nucleation layer 14A, AlGaN and/or GaN layers 14B, 14C, and/or other semiconductor layers typically used for a transistor 30.

A stress controlling layer 16 can be grown over the set of semiconductor layers 14. As illustrated, the stress controlling layer 16 can have a variable thickness, which can result in varying strain in the lateral regions of the semiconductor layer 14C. The stress controlling layer 16 can be formed of, for example, an epitaxially (and/or pseudomorphically) grown group III nitride semiconductor layer. However, it is understood that the stress controlling layer 16 can be formed of any material capable of influencing the strain within the underlying semiconductor layer 14C. For example, the stress controlling layer 16 can modify the strain of the semiconductor layer 14C when, for example, the stress controlling layer 16 is deposited at a high temperature and cooled to induce stresses within the underlying semiconductor layer 14C. In this case, the expansion or contraction of the material of the stress controlling layer 16 relative to the expansion or contraction of the material of the semiconductor layer 14C can induce corresponding stresses onto the semiconductor layer 14C. Varying stresses in the semiconductor layer 14C can lead to variation in piezoelectric polarization, which can affect the density of carriers. For example, the transistor 30 can comprise a structure of a HEMT, with a two dimensional electron gas formed at the interface of the semiconductor layers 14B, 14C. The density of such electron gas can be significantly affected by piezopolarization in the semiconductor layer 14C. In an embodiment, the transistor 30 is a normally on transistor. Alternatively, the transistor 30 can comprise a normally off transistor due to the stresses caused by the stress controlling layer 16 under the gate contact 34.

Regardless, the transistor 30 is shown including source and drain contacts 32A, 32B, respectively, and a gate contact 34. Each contact 32A, 32B, 34 can be formed directly on the stress controlling layer 16. In an embodiment, each contact 32A, 32B, 34 is formed on a portion of the stress controlling layer 16 having a lower thickness than other portions of the stress controlling layer 16. In this case, the regions of the stress controlling layer 16 that extend beyond that gate contact 34 can create a larger strain. For cases when the stress controlling layer 16 is insulating or has a low conductivity, one or more of the contacts 32A, 32B, 34 can be designed to penetrate the stress controlling layer 16. To this extent, the stress controlling layer 16 can comprise patterning, which allows the contact(s) 32A, 32B, 34 to penetrate the stress controlling layer 16. In some cases, placement of the contact(s) 32A, 32B, 34 can be achieved by forming a vacancy within the stress controlling layer 16.

While each contact 32A, 32B, 34 is shown formed on the stress controlling layer 16, it is understood that one or more of the contacts 32A, 32B, 34 can be formed adjacent to the stress controlling layer 16, e.g., directly on the underlying semiconductor layer 14C. For example, an embodiment of the stress controlling layer 16 can be located under the gate 34 and extend therefrom into only a portion of one or both of the source-gate and/or gate-drain spacings. Similarly, while the stress controlling layer 16 is shown as having a substantially uniform thickness below each contact 32A, 32B, 34, it is understood that the stress controlling layer 16 can have a varying thickness below one or more of the contacts 32A, 32B, 34. For example, the stress controlling layer 16 can have a thickness that varies under the gate contact 34 to create a variable threshold voltage under the gate contact 34. In a more particular embodiment, the variable threshold voltage is configured to increase the gate voltage swing towards the drain contact 32B. In another embodiment, a thickness of the stress controlling layer 16 can vary in a direction along a width of the device 30 to create conditions, e.g., due to electromagnetic fields induced through piezo-polarization, for the current spreading in the source-gate and/or gate-drain sections of the device 30.

Figure 6:
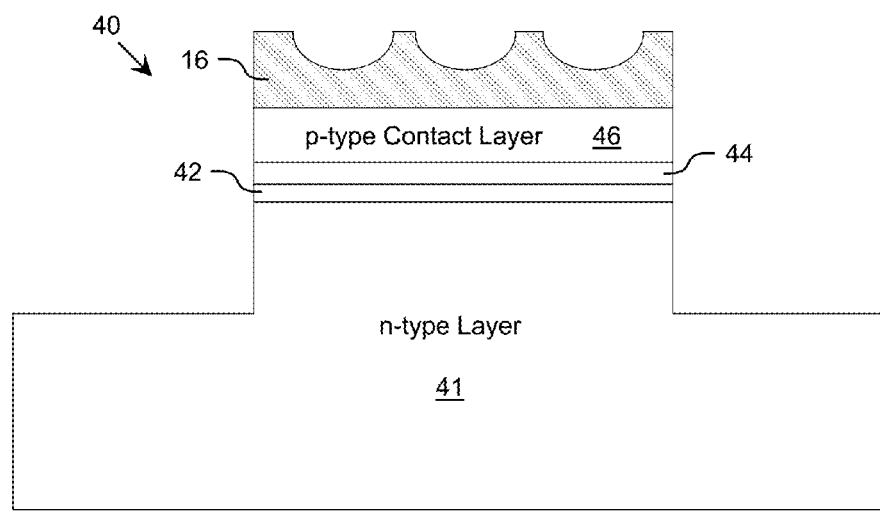
FIG. 6 shows an illustrative heterostructure for fabricating an optoelectronic device according to an embodiment.

FIG. 6 shows an illustrative heterostructure 40 for fabricating an optoelectronic device according to an embodiment. The optoelectronic device can comprise a device configured to emit electromagnetic radiation during use or a device configured to detect electromagnetic radiation during use. Illustrative optoelectronic devices include a light emitting diode, a laser diode, a photodiode, and/or the like. Additionally, a device can be implemented as part of an emitter-detector pair, an optoelectronic integrated circuit including photonic and electronic components, and/or the like.

An illustrative optoelectronic device is a light emitting diode (LED), which will be used to illustrate further aspects of the invention. Regardless, the heterostructure 40 can include an n-type layer 41, an active region 42, which can be configured to generate light when the corresponding device is operated, and an electron blocking layer 44. A p-type contact layer 46 can be grown on the electron blocking layer 44 and a stress controlling layer 16 can be fabricated on the p-type contact layer 46. The stress controlling layer 16 can be configured to modify stress properties of the p-type contact layer 46. For a group III nitride-based heterostructure 40, the p-type contact layer 46 can be formed of a material having the lowest band gap in the heterostructure 40, for example, gallium nitride (GaN). It is understood that the heterostructure 40 can be configured to generate light of various wavelengths. To this extent, the layers 41, 42, 44 can comprise layers of group III nitride semiconductors such as layers of $Al_xGa_{1-x}N$, AlN, $Al_xIn_yB_zGa_{1-x-y-z}N$, and/or the like, with various molar fractions of x, y and z. The variation of thickness of the stress controlling layer 16 can have any desirable profile, and can include patterning that can be fabricated through, for example, a photolithographic process with subsequent etching. Alternatively, the variations in thickness of the stress controlling layer 16 can be achieved by selective area overgrowth as is known in art.

In addition to controlling the stress within the p-type contact layer 46, the stress controlling layer 16 can have an effect that is propagated through the p-type contact layer 46 and into lower semiconductor layers, such as the electron blocking layer 44 and/or the active region 42. In an embodiment, stress control in semiconductor layers that are not immediately adjacent to the stress controlling layer 16 is achieved by patterning the intervening semiconductor layer(s) prior to depositing the stress controlling layer 16. Stress control of all semiconductor layers in a heterostructure can provide, for example, an improved reliability and/or efficiency of the device.

Figure 7A:
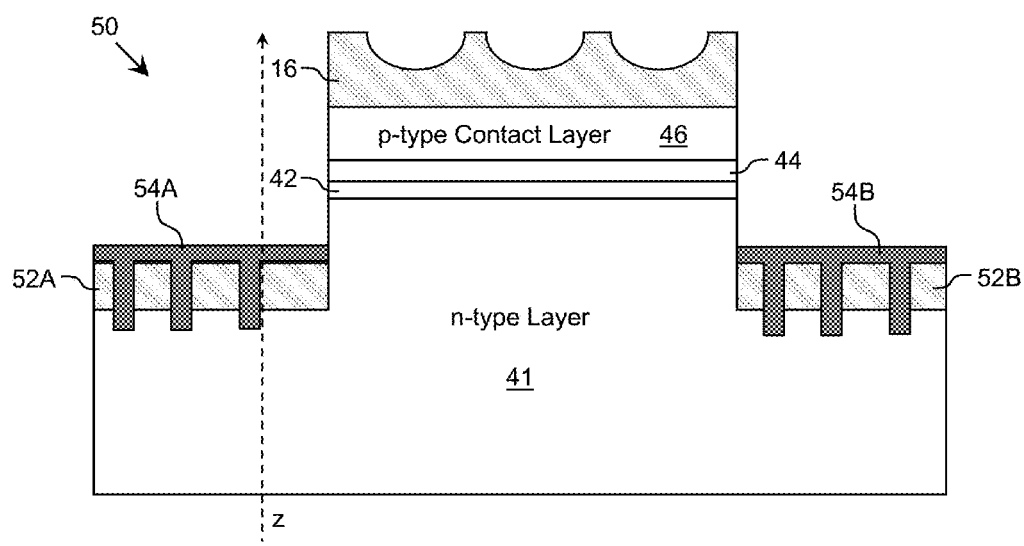

Furthermore, an optoelectronic device can include a stress controlling layer for an n-type contact. To this extent, FIG. 7A shows an illustrative optoelectronic device 50 according to an embodiment. In this case, the optoelectronic device 50 can be fabricated using the heterostructure 40 (FIG. 6). The optoelectronic device 50 can include a set of stress controlling layers 52A, 52B for each n-type contact area located adjacent to a mesa structure including the active region 42. Additionally, an n-type contact electrode 54A, 54B can be fabricated on each stress controlling layer 52A, 52B. As illustrated, the n-type contact electrode 54A, 54B can include domains that penetrate completely through the stress controlling layer 52A, 52B and into a portion of the n-type layer 41, thereby providing the stress controlling layer 52A, 52B with a varying thickness (e.g., regions with a thickness of zero). While the electrodes 54A, 54B and stress controlling layers 52A, 52B are shown contacting the n-type layer 41 in the mesa structure, it is understood that this is only illustrative and the electrodes 54A, 54B and/or the stress controlling layers 52A, 52B can be physically separated from the mesa structure.

Figure 7B:
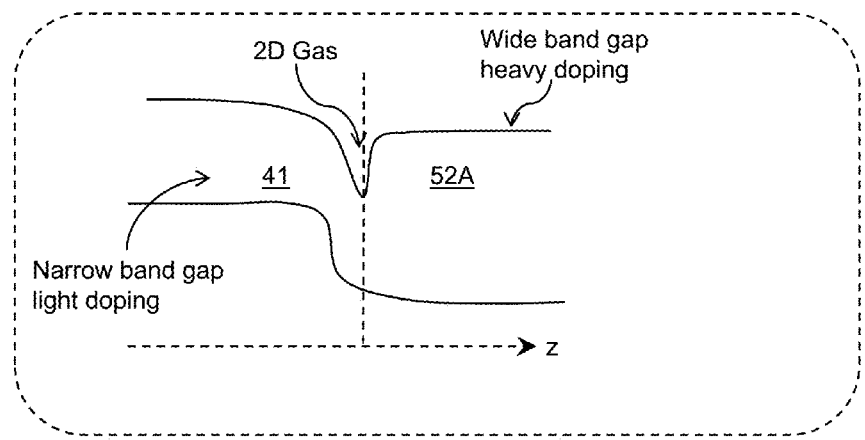
FIG. 7B shows illustrative band gaps at an interface between a stress controlling layer and a n-type layer according to an embodiment.

In an illustrative embodiment, a stress controlling layer 52A, 52B can be a layer of material that is heavily doped. Additionally, for a group III nitride optoelectronic device 50, a stress controlling layer 52A, 52B can have a molar fraction of aluminum that differs from that of the underlying n-type layer 41. For example, as shown in FIG. 7B, the stress controlling layer 52A can have a higher molar fraction of aluminum than the n-type layer 41, resulting in a wider band gap as well as a high concentration of electrons at the interface of the two layers 41, 52A.

Figure 8A:
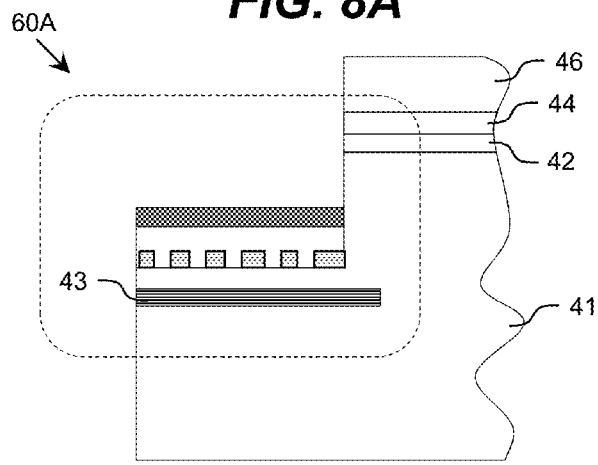
FIGS. 8A and 8B show an illustrative contact region according to an embodiment.
Figure 8B:
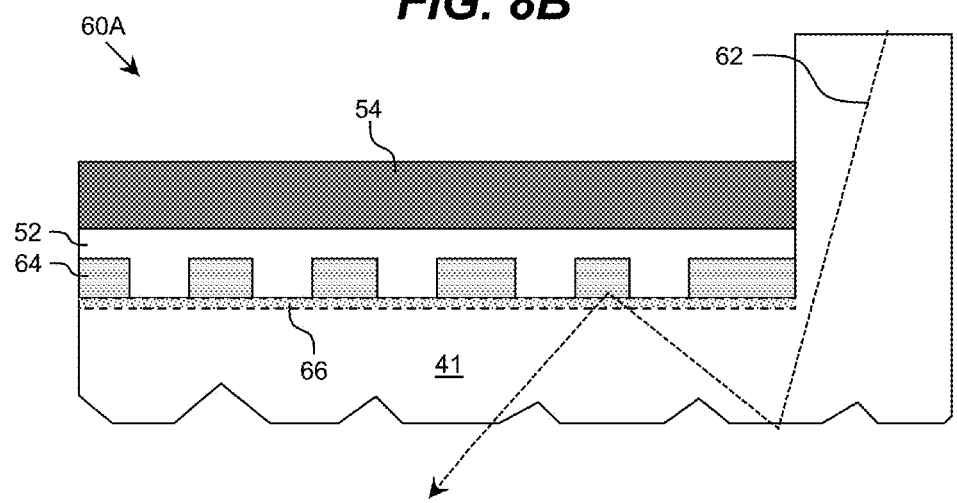

A contact region, such as an n-type contact region, described herein can include any combination of various features based on a set of desired performance characteristics for the corresponding device. For example, FIGS. 8A and 8B show an illustrative contact region 60A according to an embodiment. In this case, the contact region 60A can comprise an n-type contact region located adjacent to a mesa structure including the active region 42. However, it is understood that an embodiment of each contact region described herein can be included in a device as a p-type contact region.

The contact structure includes a stress controlling layer 52 on which a contact layer 54 is deposited. The stress controlling layer 52 can have a different lattice constant than the n-type layer 41 and act to modulate stresses in the region of the n-type layer 41 located below the stress controlling layer 52. In an embodiment, the stress controlling layer 52 increases a sheet conductance of the underlying semiconductor layer (e.g., the n-type layer 41) due to piezoelectric polarization. The stresses resulting from the stress controlling layer 52 can be used to localize free carriers (e.g., electrons for an n-type contact) along a boundary between the n-type layer 41 and the stress controlling layer 52 due to piezo-electric polarization and/or spontaneous polarization, resulting in formation of a two dimensional carrier (electron or hole) gas 66.

During operation of the device, the active region 42 can emit radiation. In an embodiment, a contact structure described herein can include one or more features to promote propagation of the radiation out of the device. In particular, a contact structure can be located in the heterostructure at a location at which the radiation is propagating through the heterostructure. For example, the n-type layer 41 can include one or more features, such as a reflective structure 43 (e.g., a DBR, a roughened interface between two or more layers, and/or the like), which causes radiation emitted from the active region 42 to be propagated toward a bottom surface of the contact structure. In this case, the contact structure can include one or more features for reflecting the radiation as indicated by a representative ray 62 shown in FIG. 8B.

As illustrated, the contact structure can further include a dielectric masking layer 64, which can have a lower index of refraction than the n-type layer 41. In this case, an increased number of rays 62 emitted from the active region 42 will undergo total internal reflection at the boundary between the dielectric masking layer 64 and the n-type layer 41 as compared to the boundary between the n-type layer 41 and the stress controlling layer 52. As the stress controlling layer 52 is formed over a dielectric masking layer 64 including openings, regions of the n-type layer 41 below the stress controlling layer 52 are not contacted by the stress controlling layer 52. Additionally, the stress controlling layer 52 has a varying thickness as a result of penetrating the openings in the dielectric masking layer 41.

A contact structure can include one or more additional features, e.g., to improve one or more target properties of the contact. For example, FIGS. 9A and 9B show an illustrative contact structure 60B according to another embodiment. In this case, the contact structure 60B includes a contact layer 54 (e.g., a metal) that penetrates the stress controlling layer 52, dielectric masking layer 64, and a portion of the n-type layer 41. In this configuration, the contact layer 54 directly contacts the two dimensional carrier gas 66, thereby improving electrical properties of the contact structure 60B. Additionally, regions 68 in which the contact layer 54 terminates in the n-type layer 41 can serve as scattering centers for the radiation as illustrated.

Figure 10A:
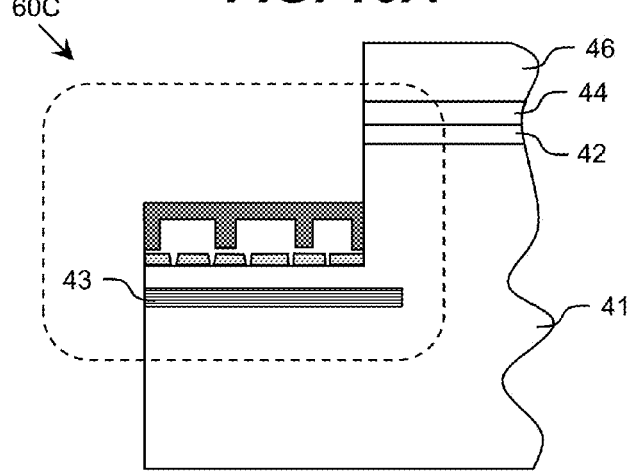
FIGS. 10A and 10B show an illustrative contact structure according to still another embodiment.
Figure 10B:
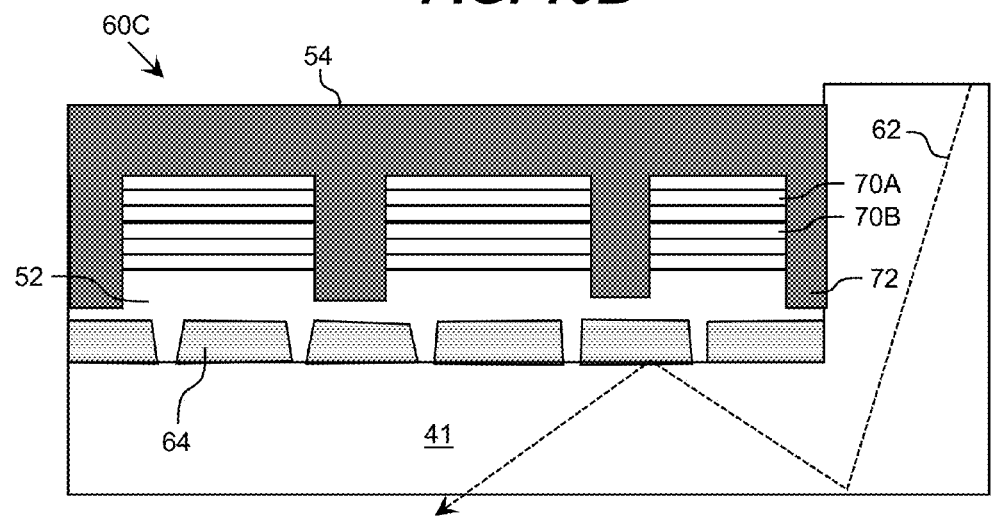

In an embodiment, the stress controlling layer 52 can include one or more subscale features. For example, FIGS. 10A and 10B show an illustrative contact structure 60C according to still another embodiment. In this case, the contact structure 60C includes a complex stress controlling layer 52, which includes one or more attributes that vary. For example, the stress controlling layer 52 can include a varying composition, varying V/III ratio, and/or the like, where the variations exceed those of unintended variations due to the limitations of a growth procedure.

In a more particular embodiment, the stress controlling layer 52 includes a plurality of sub-layers, such as sub-layers 70A, 70B. Such sub-layers 70A, 70B can comprise, for example, a superlattice or laminate of semiconductor (e.g., group III nitride) layers with changing composition and/or V/III ratios between immediately adjacent sub-layers 70A, 70B. The sub-layers 70A, 70B can form a heterostructure with each sub-layer 70A, 70B having a different composition from the immediately adjacent sub-layer(s) of the stress controlling layer 52. The different compositions can result in a two-dimensional gas forming at the interface of these sub-layers 70A, 70B. In a more particular embodiment, each sub-layer 70A, 70B can be grown using, for example, a different V/III ratio than an immediately adjacent sub-layer resulting in a lattice mismatch between the sub-layers, and subsequently resulting in the two-dimensional gas forming induced by piezo-polarization of the strained sub-layers.

As further illustrated, the contact layer 54 can have protrusions (e.g., of metal) that extend into the stress controlling layer 52, e.g., through at least some of the sub-layers 70A, 70B. A protrusion 72 can be created to form a good contact between the stress controlling layer 52 (the corresponding sub-layers 70A, 70B) and the mesa region immediately adjacent thereto, which can comprise, for example, a heavily doped n-type semiconductor layer 41.

Figure 11A:
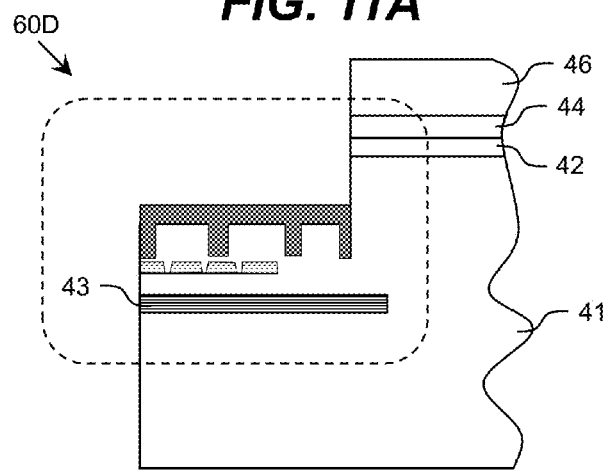
FIGS. 11A and 11B show another illustrative contact structure according to an embodiment.
Figure 11B:
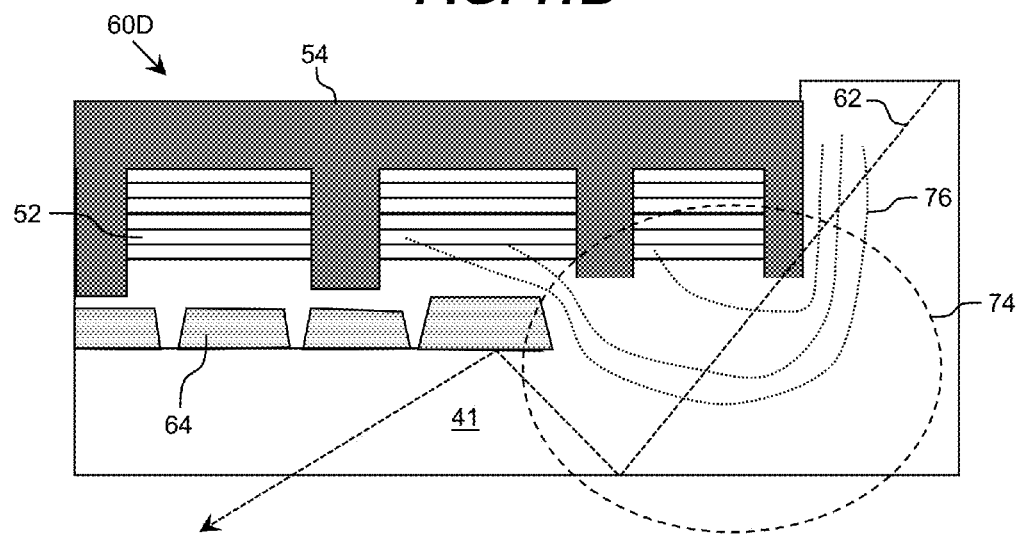

It is understood that a stress controlling layer and/or a dielectric masking layer described herein may extend over only a portion of the lateral area of a contact region. For example, FIGS. 11A and 11B show another illustrative contact structure 60D according to an embodiment. In this case, the dielectric masking layer 64 is only present on an outer portion of the contact structure 60D, while the portion of the contact structure adjacent to the mesa structure, as indicated by region 74 does not include the dielectric masking layer 64. In this configuration, an improved current flow between the mesa region and the contact layer 54 can be obtained as indicated by the current lines 76. In an illustrative embodiment, the region 74 comprises a heavily doped semiconductor region to further improve the conduction there through.

Figure 12A:
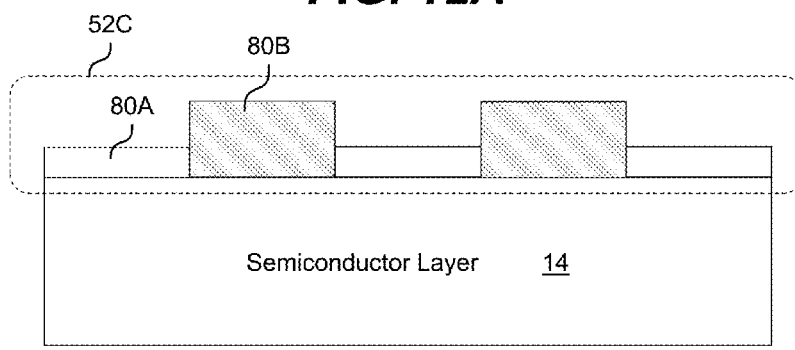
FIGS. 12A and 12B show illustrative stress controlling layers according to embodiments.
Figure 12B:
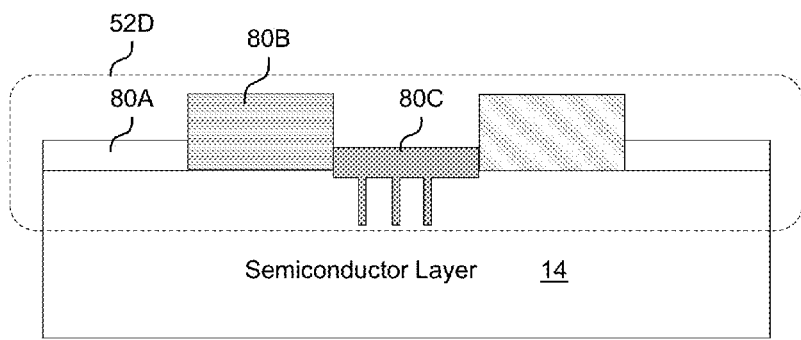

A stress controlling layer described herein also can include one or more sub-scale features that vary laterally. To this extent, FIGS. 12A and 12B show illustrative stress controlling layers 52C, 52D according to embodiments. The stress controlling layer 52C is shown including first group of domains 80A formed of a first material and a second group of domains 80B formed of a second material, while the stress controlling layer 52D is also shown including a third group of domains 80C. As illustrated, the domains 80A-80C for each different material can have a different thickness. However, it is understood that this is only illustrative. Furthermore, it is understood that different domains of a same material can have differing heights.

In an illustrative embodiment, the material of each domain 80A-80C can be selected based on one or more desired attributes. Illustrative attributes can include electric, mechanical, and optical attributes of the materials. For example, one domain can be formed of a material more transparent to radiation than another domain. In a more particular illustrative embodiment, each domain 80A-80C can comprise a group III nitride material with differing aluminum molar fractions. Furthermore, it is understood that the domains 80A-80C can be formed using any combination of one or more fabrication processes suitable for the corresponding material. For example, a first material can be deposited on the semiconductor layer 14 (e.g., a metallic domain 80C), while a second material can be epitaxially grown on the semiconductor layer 14. Regardless, each domain 80A-80C will exert a corresponding stress and strain over the underlying semiconductor layer 14 as described herein. It is understood that a stress controlling layer described herein can include any combination of different materials, and different material domains can be arranged in a periodic or aperiodic pattern.

Figure 13:
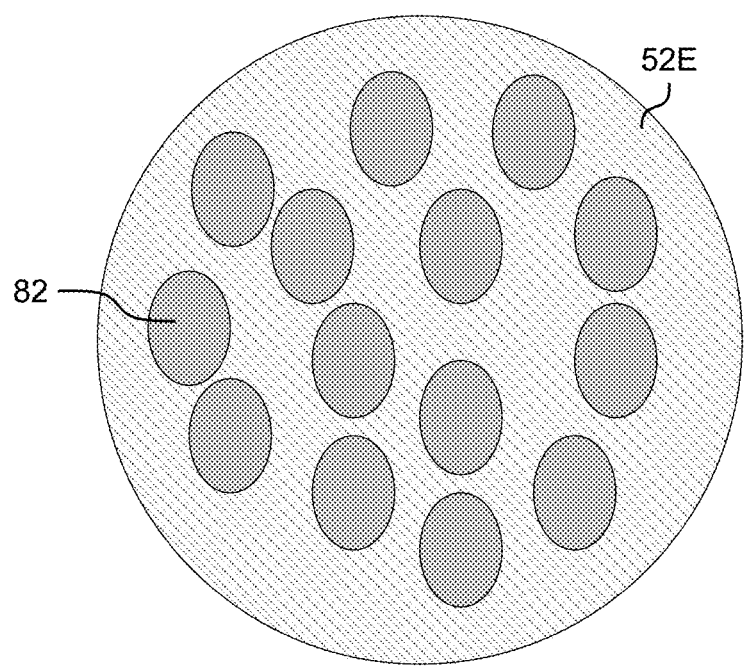
FIG. 13 shows a top view of an illustrative stress controlling layer according to another embodiment.

FIG. 13 shows a top view of an illustrative stress controlling layer 52E according to another embodiment. In this case, the stress controlling layer 52E can comprise a layer located between an underlying semiconductor layer and ambient. In this case, when implemented as part of an optoelectronic device, the stress controlling layer 52E can have an index of refraction selected to facilitate extraction of light from the corresponding semiconductor device. For example, the stress controlling layer 52E can comprise a light transparent material having an index of refraction value between the value of the underlying semiconductor material and that of ambient. Furthermore, the stress controlling layer 52E can have a shape, such as a lens, to facilitate light extraction from the corresponding device.

In an illustrative embodiment, the stress controlling layer 52E can be formed as part of a contact layer. In this case, the stress controlling layer 52E can include domains 82 of metal, which are embedded within its surface. Such metallic domains 82 can have a corresponding size, number, and/or arrangement, which is selected based on a desired redirection and/or reflection of light emitted from the optoelectronic device. For example, a stress controlling layer described herein, such as the stress controlling layer 52E, can have a periodic pattern which is configured to enhance radiation extraction from a corresponding optoelectronic device and/or radiation coupling to the optoelectronic device. In a more particular embodiment, the stress controlling layer 52E can have domains 82 deposited thereon, which create a plasmonic or photonic crystal nanostructure to facilitate light extraction and/or beam shaping or radiation coupling.

While illustrative aspects of the invention have been shown and described herein primarily in conjunction with a stress controlling layer and the corresponding heterostructures and devices including such a layer, as well as methods of fabricating such a heterostructure and/or device, it is understood that aspects of the invention further provide various alternative embodiments.

Figure 14:
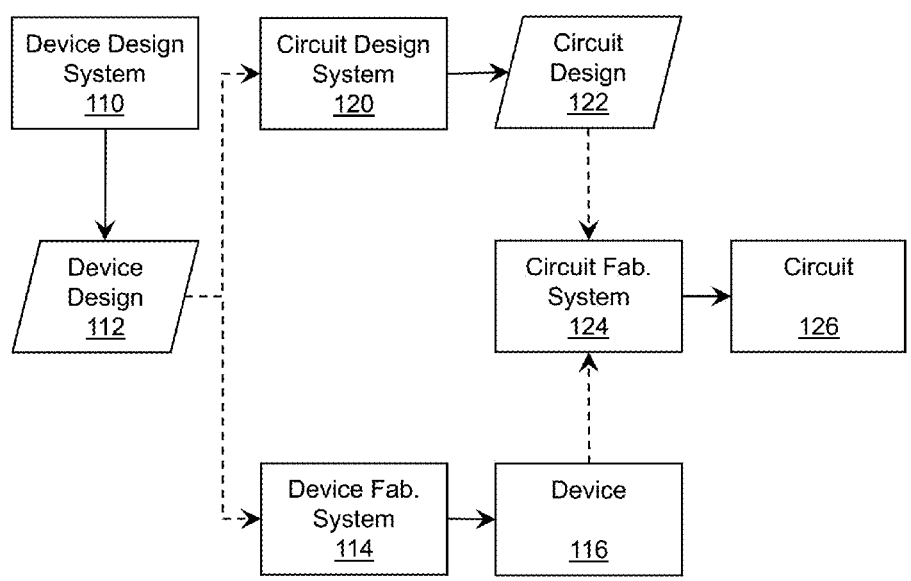
FIG. 14 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 14 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of fabricating a device, the method comprising:
    fabricating a heterostructure for the device, wherein the fabricating the heterostructure includes fabricating a stress controlling layer directly on a surface of a semiconductor layer in a set of semiconductor layers, wherein the fabricating the stress controlling layer includes varying at least one attribute of the stress controlling layer as a function of a lateral position based on a target variation of stresses in the semiconductor layer, wherein the varying includes varying a thickness of the stress controlling layer by 2 to 10 microns; and
    forming at least one contact directly on the stress controlling layer.

2. The method of claim 1, wherein the varying includes adjusting stress in the stress controlling layer using at least one of: thermal annealing or laser thermal annealing.

3. The method of claim 1, wherein the varying includes varying a material of the stress controlling layer.

4. The method of claim 1, wherein the device is a field effect transistor, and wherein the forming at least one contact includes fabricating a source contact, a drain contact, and a gate contact on the stress controlling layer.

5. The method of claim 4, wherein the gate contact is located directly on the stress controlling layer.

6. The method of claim 5, wherein the stress controlling layer includes at least one region that extends beyond the gate into at least a portion of at least one of: a source-gate spacing or a gate-drain spacing, and wherein the at least one region creates a larger stress in the semiconductor layer than a stress created under the gate contact.

7. The method of claim 5, wherein the field effect transistor is a normally off transistor due to an amount of stress created under the gate contact.

8. The method of claim 1, wherein the fabricating the heterostructure further comprises:
    fabricating an additional semiconductor layer in the heterostructure; and
    fabricating a second stress controlling layer directly on the additional semiconductor layer.

9. The method of claim 1, wherein the device is an optoelectronic device, and wherein the semiconductor layer is a p-type contact layer.

10. The method of claim 9, wherein the heterostructure includes a plurality of group III nitride layers, and wherein the p-type contact layer is gallium nitride.

11. The method of claim 1, wherein the device is an optoelectronic device, and wherein the semiconductor layer is a n-type layer.

12. The method of claim 1, wherein the stress controlling layer includes a plurality of sub-layers.

13. The method of claim 1, wherein the at least one contact penetrates at least a portion of the stress controlling layer.

14. The method of claim 11, further comprising applying a dielectric masking layer on a portion of the surface of the semiconductor layer, wherein the stress controlling layer penetrates openings in the dielectric masking layer and directly contacts the semiconductor layer.

15. A method of fabricating an optoelectronic device, the method comprising:

fabricating a heterostructure for the device, wherein the fabricating the heterostructure includes fabricating a stress controlling layer directly on a surface of a semiconductor layer in a set of semiconductor layers, wherein the fabricating the stress controlling layer includes varying a thickness of the stress controlling layer as a function of a lateral position based on a target variation of stresses in the semiconductor layer;

applying a dielectric masking layer on a portion of the surface of the semiconductor layer, wherein the stress controlling layer penetrates openings in the dielectric masking layer and directly contacts the semiconductor layer; and forming at least one contact directly on the stress controlling layer.

16. The method of claim 15, wherein the at least one contact penetrates at least a portion of the stress controlling layer.

17. The method of claim 15, wherein the at least one contact comprises at least one of: a p-type contact or an n-type contact adjacent to a mesa structure including an active region.

18. A method of fabricating a device, the method comprising:

fabricating a group III nitride heterostructure for the device, wherein the fabricating the heterostructure includes fabricating a stress controlling layer directly on a surface of a group III nitride semiconductor layer in a set of group III nitride semiconductor layers, wherein the fabricating the stress controlling layer includes varying a thickness of the stress controlling layer as a function of a lateral position based on a target variation of stresses in the group III nitride semiconductor layer; and applying a dielectric masking layer on a portion of the surface of the semiconductor layer, wherein the stress controlling layer penetrates openings in the dielectric masking layer and directly contacts the semiconductor layer; and forming at least one contact directly on the stress controlling layer.

19. The method of claim 18, wherein the at least one contact penetrates at least a portion of the stress controlling layer.

20. The method of claim 18, wherein the fabricating the stress controlling layer includes epitaxially growing the stress controlling layer directly on the group III nitride semiconductor layer and the dielectric masking layer.

* * * * *